United States Patent
Jo et al.

(10) Patent No.: US 9,614,092 B2
(45) Date of Patent: Apr. 4, 2017

(54) THIN FILM TRANSISTOR ARRAY PANEL AND METHOD OF MANUFACTURING THE SAME

(71) Applicant: SAMSUNG DISPLAY CO., LTD., Yongin-si, Gyeonggi-do (KR)

(72) Inventors: Jung Yun Jo, Namyangju-si (KR); Ki Seong Seo, Seoul (KR); Eun Jeong Cho, Busan (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/879,993

(22) Filed: Oct. 9, 2015

(65) Prior Publication Data
US 2016/0197197 A1   Jul. 7, 2016

(30) Foreign Application Priority Data

Jan. 2, 2015 (KR) .................. 10-2015-0000225

(51) Int. Cl.
| | | |
|---|---|---|
| *H01L 21/00* | (2006.01) | |
| *H01L 29/786* | (2006.01) | |
| *H01L 29/66* | (2006.01) | |
| *H01L 21/02* | (2006.01) | |
| *H01L 27/12* | (2006.01) | |

(52) U.S. Cl.
CPC .. *H01L 29/78675* (2013.01); *H01L 21/02488* (2013.01); *H01L 21/02532* (2013.01); *H01L 21/02667* (2013.01); *H01L 21/02686* (2013.01); *H01L 27/1222* (2013.01); *H01L 29/66757* (2013.01)

(58) Field of Classification Search
CPC ............... H01L 29/66757; H01L 29/78675
USPC ............................................ 438/149
See application file for complete search history.

(56) References Cited

U.S. PATENT DOCUMENTS

| | | | |
|---|---|---|---|
| 2013/0256668 A1* | 10/2013 | Oh .................. | H01L 29/78633 257/59 |
| 2014/0167049 A1* | 6/2014 | Oda .................. | H01L 27/1285 257/57 |
| 2015/0144951 A1 | 5/2015 | Kim et al. | |

FOREIGN PATENT DOCUMENTS

| | | |
|---|---|---|
| KR | 10-2000-0059403 A | 10/2000 |
| KR | 10-0599966 B1 | 7/2006 |
| KR | 10-2012-0020941 A | 3/2012 |

OTHER PUBLICATIONS

Jun et al., "Composition, oxidation, and optical properties of fluorinated silicon nitride film by inductively coupled plasma enhanced chemical vapor deposition." Journal of Materials Research, vol. 14, No. 3, Mar. 1999.

* cited by examiner

*Primary Examiner* — Douglas Menz
(74) *Attorney, Agent, or Firm* — Innovation Counsel LLP

(57) ABSTRACT

A thin film transistor array panel according to an exemplary embodiment of the present invention includes: an insulating substrate; a polycrystal semiconductor layer formed on the insulating substrate; a buffer layer formed below the polycrystal semiconductor layer and containing fluorine; a gate electrode overlapping the polycrystal semiconductor layer; a source electrode and a drain electrode overlapping the polycrystal semiconductor layer and separated from each other; and a pixel electrode electrically connected to the drain electrode.

7 Claims, 15 Drawing Sheets

FIG. 11

Characteristics of SiNF thin film

|  | SiNx | SiNF |
|---|---|---|
| D/R(Å/s) | 18.7 | 15.6 |
| Rrefractive index @633nm | 1.874 | 1.851 |
| [N-H]/[Si-H] | 0.88 | 0.21 |
| Total amount of hydrogen(at%) | 23.96 | 13.9 |
| Stress(Mpa) | 289 | -34.9 |
| Etch rate(Å/s) ** | 47.8 | 6.6 |
| Eo(eV) | 3.59 | 2.33 |

FIG. 12

Characteristics of SiONF thin film

|  | SiOx | SiOF |
|---|---|---|
| D/R(Å/s) | 18.6 | 20.3 |
| Rrefractive index @633nm | 1.461 | 1.450 |
| Si-O peak position (cm$^{-1}$) | 1056.5 | 1067.0 |
| Total amount of hydrogen(at%) | 6.01 | 3.69 |
| Stress(Mpa) | -440.0 | -291.9 |
| Etch rate(Å/s) ** | 4.4 | 5.9 |

THIN FILM TRANSISTOR ARRAY PANEL AND METHOD OF MANUFACTURING THE SAME

CROSS-REFERENCE TO RELATED APPLICATION

This application claims priority to, and the benefit of, Korean Patent Application No. 10-2015-0000225 filed in the Korean Intellectual Property Office on Jan. 2, 2015, the entire contents of which are incorporated herein by reference.

BACKGROUND (a) Field

Embodiments of the present invention relate generally to flat panel displays. More specifically, embodiments of the present invention relate to thin film transistor array panels and their methods of manufacture.

(b) Description of the Related Art

A thin film transistor (TFT) has been used in various fields, for example as a switching and driving device in flat display devices such as liquid crystal displays (LCDs), organic light emitting diode displays (OLED Displays) and electrophoretic displays.

The TFT includes a gate electrode connected to a gate line transferring a scanning signal, a source electrode connected to a data line transferring a signal to be applied to a pixel electrode, a drain electrode facing the source electrode, and a semiconductor electrically connected to the source electrode and the drain electrode.

The semiconductor is an important factor in determining characteristics of the thin film transistor. Silicon (Si) is the most widely used semiconductor. Silicon is classified as an amorphous silicon or polysilicon depending on its crystal form, wherein amorphous silicon is relatively easily manufactured but has low charge mobility, while polysilicon has problems such as film burst in manufacturing.

The above information disclosed in this Background section is only for enhancement of understanding of the background of the invention and therefore it may contain information that does not form the prior art that is already known in this country to a person of ordinary skill in the art.

SUMMARY

Embodiments of the present invention provide a thin film transistor array panel and a method of manufacturing the same, having advantages of preventing polycrystal semiconductor layer film bursting and improved durability.

An exemplary embodiment of the present invention provides a thin film transistor array panel including: an insulating substrate; a polycrystal semiconductor layer formed on the insulating substrate; a buffer layer formed below the polycrystal semiconductor layer and containing fluorine; a gate electrode overlapping the polycrystal semiconductor layer; a source electrode and a drain electrode overlapping the polycrystal semiconductor layer and separated from each other; and a pixel electrode electrically connected to the drain electrode.

The buffer layer may comprise one or more hydrogen diffusion prevention layers each including the fluorine.

The one or more hydrogen diffusion prevention layers may each comprise a material of the buffer layer and the fluorine.

The buffer layer may include a SiNx layer and a SiOx layer stacked on the SiNx layer, and the one or more hydrogen diffusion prevention layers may be deposited at one or more of a middle of the SiNx layer, an interface between the SiNx layer and the SiOx layer, a middle of the SiOx layer, and above the SiOx layer.

The hydrogen diffusion prevention layer may each comprise SiOF or SiNF.

Another embodiment of the present invention provides a method of manufacturing a thin film transistor array panel, the method including: stacking a buffer layer containing fluorine on an insulating substrate; stacking an amorphous silicon (a-Si) layer on the buffer layer; performing a dehydrogenation process on the buffer layer and the amorphous silicon layer; crystallizing the amorphous silicon layer so as to form a polysilicon (poly-Si) layer; forming a polycrystal semiconductor layer by patterning the polysilicon layer; forming a gate electrode overlapping the polycrystal semiconductor layer; forming a source electrode and a drain electrode overlapping the polycrystal semiconductor layer and separated from each other; and forming a pixel electrode electrically connected to the drain electrode.

The stacking a buffer layer may further comprise forming one or more hydrogen diffusion prevention layers that include the fluorine.

The one or more hydrogen diffusion prevention layers may comprise a material of the buffer layer and may further comprise the fluorine.

The one or more hydrogen diffusion prevention layers may be formed by plasma treatment using a gas containing the fluorine.

The stacking a buffer layer may further comprise stacking a SiOx layer on a SiNx layer, and the forming one or more hydrogen diffusion prevention layers may be performed during a process of stacking the SiNx layer, after a process of stacking the SiNx layer, during a process of stacking the SiOx layer, and after a process of stacking the SiOx layer.

The one or more hydrogen diffusion prevention layers may comprise SiOF or SiNF.

The one or more hydrogen diffusion prevention layers may be formed by plasma treatment using a gas containing fluorine.

According to methods of manufacturing the thin film transistor array panel of the present invention, durability of the polycrystal semiconductor layer may be improved, and characteristics of the thin film transistor may be improved.

BRIEF DESCRIPTION OF THE DRAWINGS

FIG. 11 is a Table showing experimental results according to an exemplary embodiment of the present invention.

FIG. 12 is a Table showing experimental results according to an exemplary embodiment of the present invention.

DETAILED DESCRIPTION OF THE EMBODIMENTS

Figure 1:
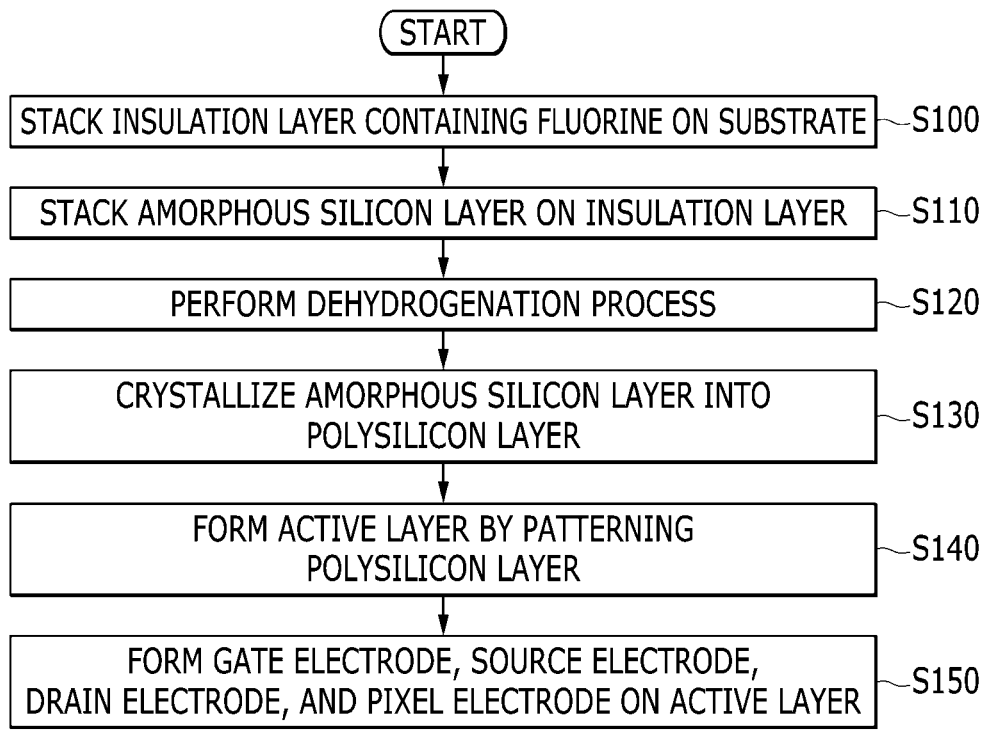
FIG. 1 is a flow chart of a method of manufacturing a thin film transistor array panel according to an exemplary embodiment of the present invention.

Hereinafter, exemplary embodiments of the present invention will be described in detail with reference to the accompanying drawings so that those skilled in the art may easily practice the present invention. However, the present invention is not limited to the exemplary embodiments which are described herein, and may be modified in various different ways.

Accordingly, the drawings and description are to be regarded as illustrative in nature and not restrictive. Like reference numerals designate like elements throughout the specification.

In addition, in various exemplary embodiments, a first exemplary embodiment will be representatively described and therefore, only components other than those of the first exemplary embodiment will be described in other exemplary embodiments.

In addition, in the drawings, the size and thickness of each component shown in the drawings are optionally shown for convenience of explanation, for example, thickness is exaggerated for clearly expressing various layers and regions in the drawings, and therefore, the present invention is not necessarily limited to the shown exemplary embodiments in the drawings. Also, the drawings are not to scale.

All numerical values are approximate, and may vary. All examples of specific materials and compositions are to be taken as nonlimiting and exemplary only. Other suitable materials and compositions may be used instead.

It will be understood that when an element such as a layer, film, region, or substrate is referred to as being "on", "above", or "below" another element, it may be directly on the other layer or substrate or intervening elements may also be present. In addition, it will be understood that when an element such as a layer, film, region, or substrate is referred to as being "in the middle of" another element, the element may be disposed at the exact middle position in view of the distance and between the elements.

In addition, unless explicitly described to the contrary, the word "comprise" and variations such as "comprises" or "comprising", will be understood to imply the inclusion of stated elements but not the exclusion of any other elements.

Hereinafter, a thin film transistor array panel and a method of manufacturing the same according to an exemplary embodiment of the present invention will be described with reference to FIGS. 1 and 2.

Figure 2:
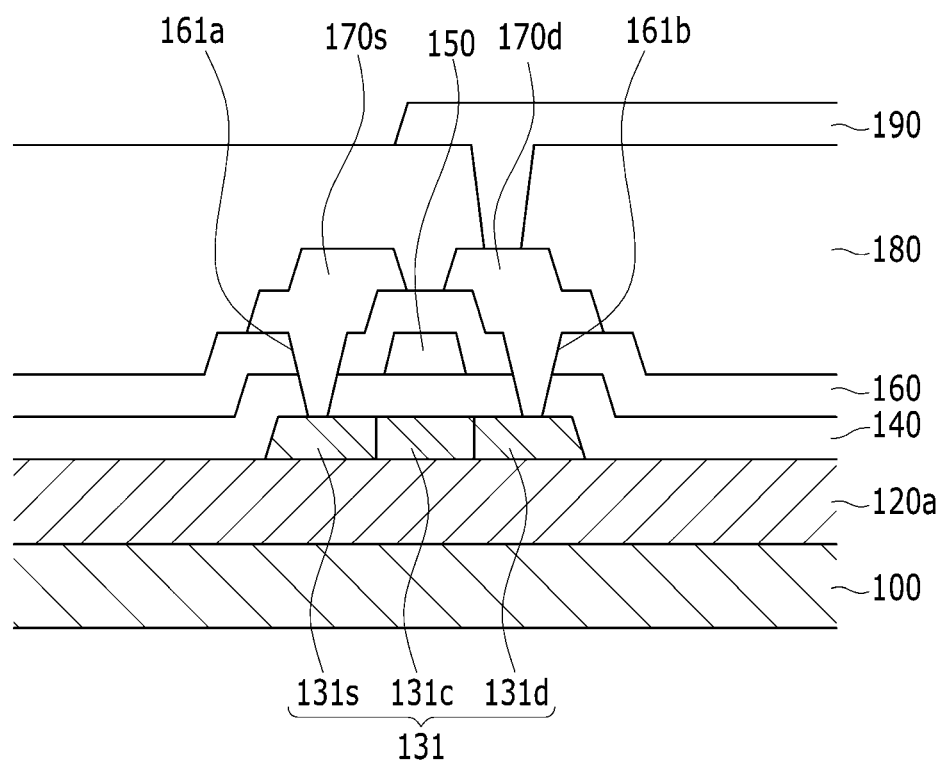
FIG. 2 schematically shows a thin film transistor array panel according to an exemplary embodiment of the present invention.

FIG. 1 is a flow chart of a manufacturing method for a thin film transistor array panel according to an exemplary embodiment of the present invention, and FIG. 2 schematically shows a thin film transistor array panel according to an exemplary embodiment of the present invention.

First, referring to FIG. 2, the thin film transistor array panel according to an exemplary embodiment of the present invention may include an insulation substrate 100, a buffer layer 120a containing fluorine, a polycrystal semiconductor layer 131, a gate electrode 150, a source electrode 170s, a drain electrode 170d, and a pixel electrode 190.

Referring to FIG. 2, the insulation substrate 100 may include the buffer layer 120a containing fluorine, and the polycrystal semiconductor layer 131 on the buffer layer 120a. A gate insulation layer 140 is disposed on the polycrystal semiconductor layer 131, the gate electrode 150 is disposed on the gate insulation layer 140, and an interlayer insulation layer 160 is disposed on the gate electrode 150. A first contact hole 161a for connecting the source electrode 170s with a source region 131s of the polycrystal semiconductor layer 131 and a second contact hole 161b for connecting the drain electrode 170d with a drain region 131d of the polycrystal semiconductor layer 131 are formed in the interlayer insulation layer 160 and the gate insulation layer 140. In addition, the source electrode 170s and the drain electrode 170d overlapping the polycrystal semiconductor layer 131 and separated from each other are disposed on the interlayer insulation layer 160, a planarization layer 180 is disposed on the source electrode 170s and the drain electrode 170d, and a pixel electrode 190 electrically connected to the drain electrode 170d is disposed on the planarization layer 180.

Although an exemplary embodiment is illustratively shown in FIG. 2, the present invention may be applied to other forms of transistors and panels as well. For example, embodiments of the present invention may be applied to a thin film transistor array panel having a bottom gate structure in which the gate electrode is disposed below the semiconductor layer and the source and drain electrodes, in addition to a thin film transistor array panel having a top gate structure in which the gate electrode is disposed on the semiconductor layer as shown in FIG. 2, and various kinds of insulation layers and semiconductor layers, and various kinds of electrodes may be stacked in different sequences. For example, when the present invention is applied to the bottom gate structure, the buffer layer containing fluorine is disposed on the gate electrode, and the polycrystal semiconductor layer is disposed on the buffer layer. The buffer layer may be made of an insulation material, and may act as the gate insulation layer. As described above, the buffer layer in the present invention is made of an insulation material to act as various kinds of insulation layers. In other words, when the insulation layer is disposed below the semiconductor layer, the insulation layer may act as the buffer layer of embodiments of the present invention, while containing fluorine.

The thin film transistor array panel according to an exemplary embodiment of the present invention may be applied to displays such as an organic light emitting diode (OLED), a liquid crystal display (LCD), and the like.

FIG. 1 is a flow chart of a method of manufacturing the thin film transistor array panel according to an exemplary embodiment of the present invention. Hereinafter, a method of manufacturing the thin film transistor array panel will be described with reference to FIG. 1.

First, the buffer layer 120a containing fluorine is stacked or formed on the insulation substrate 100 (S100), and the amorphous silicon layer 130 is stacked or formed on the buffer layer 120a (S110). After the stacking is completed, a dehydrogenation process is performed on the buffer layer 120a and the amorphous silicon layer 130 (S120). The dehydrogenation process is to decrease a content of hydrogen ($H_2$) in the buffer layer 120a and the amorphous silicon layer 130, and may be performed by heat treatment at a high temperature (more than 450° C.). During the dehydrogenation process, hydrogen in the buffer layer 120a is prevented from being diffused into the amorphous silicon layer 130 by the fluorine in buffer layer 120a. After the dehydrogenation process is completed, the amorphous silicon layer 130 is crystallized into a polysilicon layer (S130). The crystallization process may be performed by, for example, laser annealing. Since laser annealing is performed at a low cost and has high efficiency, laser annealing is often preferred over other low temperature crystallization technologies. As one example, an excimer laser annealing (ELA) process using an excimer laser having a wavelength of 308 nm may be used for this laser annealing. Since the laser wavelength used in the excimer laser annealing has high absorptance in the amorphous silicon layer, the amorphous silicon layer is heated and melted in a short time, so as to manufacture the polysilicon layer without damaging the insulation substrate. The polycrystal semiconductor layer 131 is formed by patterning this polysilicon layer (S140). The patterning of the polysilicon layer may be performed by a microelectromechanical system (MEMS) based process such as a photolithography process, or the like. By patterning the polycrystal silicon layer, the polycrystal semiconductor layer 131 is formed, where the polycrystal semiconductor layer 131 includes the source region 131s connected to the source electrode, the drain region 131d connected to the drain electrode, and a channel region 131c positioned between the source region 131s and the drain region 131d. Then, the gate insulation layer 140 is formed on the polycrystal semiconductor layer 131, a gate metal layer is formed on the gate insulation layer 140, and the gate metal layer is patterned to form a gate electrode 150 in an island shape on the channel region 131c of the polycrystal semiconductor layer 131. The interlayer insulation layer 160 is formed on the gate electrode 150, and the first contact hole 161a and the second contact hole 161b, exposing portions of the source region 131s and the drain region 131d of the polycrystal semiconductor layer 131 respectively, are formed by patterning the interlayer insulation layer 160 and the gate insulation layer 140 together. Then, the source electrode 170s and the drain electrode 170d are formed to contact the source region 131s and the drain region 131d of the polycrystal semiconductor layer 131, respectively, through the first contact hole 161a and the second contact hole 161b. The planarization layer 180 is formed on the source electrode 170s and the drain electrode 170d, and the pixel electrode 190 is then formed on the planarization layer 180 to be connected to the drain electrode 170d through a contact hole formed in the planarization layer 180 (S150).

Although an exemplary embodiment is illustratively shown in FIG. 1, embodiments of the present invention may be applied to methods of manufacturing thin film transistor array panels having bottom gate structures in which the gate electrode is disposed below the semiconductor layer and the source and drain electrodes, as well as methods of manufacturing thin film transistor array panels having top gate structures in which the gate electrode is disposed on the semiconductor layer as shown in FIG. 1. Embodiments of the invention also encompass various kinds of insulation layers and semiconductor layers, and various kinds of electrodes that may be stacked in different sequences. For example, when the method of the present invention is applied to the method of manufacturing the bottom gate structure, a process of stacking the buffer layer containing fluorine on the gate electrode is performed, and then, a process of stacking the amorphous silicon layer on the buffer layer is performed. The buffer layer may be made of an insulation material, and may act as the gate insulation layer. As described above, the buffer layer of embodiments of the present invention may be made of an insulation material to act as various kinds of insulation layers. In other words, when the insulation layer is disposed below the semiconductor layer, the insulation layer may act as the buffer layer of the present invention, while containing fluorine.

The method of manufacturing the thin film transistor array panel according to an exemplary embodiment of the present invention may be applied to manufacture of displays such as an organic light emitting diode (OLED), a liquid crystal display (LCD), and the like.

Hereinafter, the thin film transistor array panel and the method of manufacturing the same according to an exemplary embodiment of the present invention will be described with reference to FIGS. 3 to 9.

Figure 4:
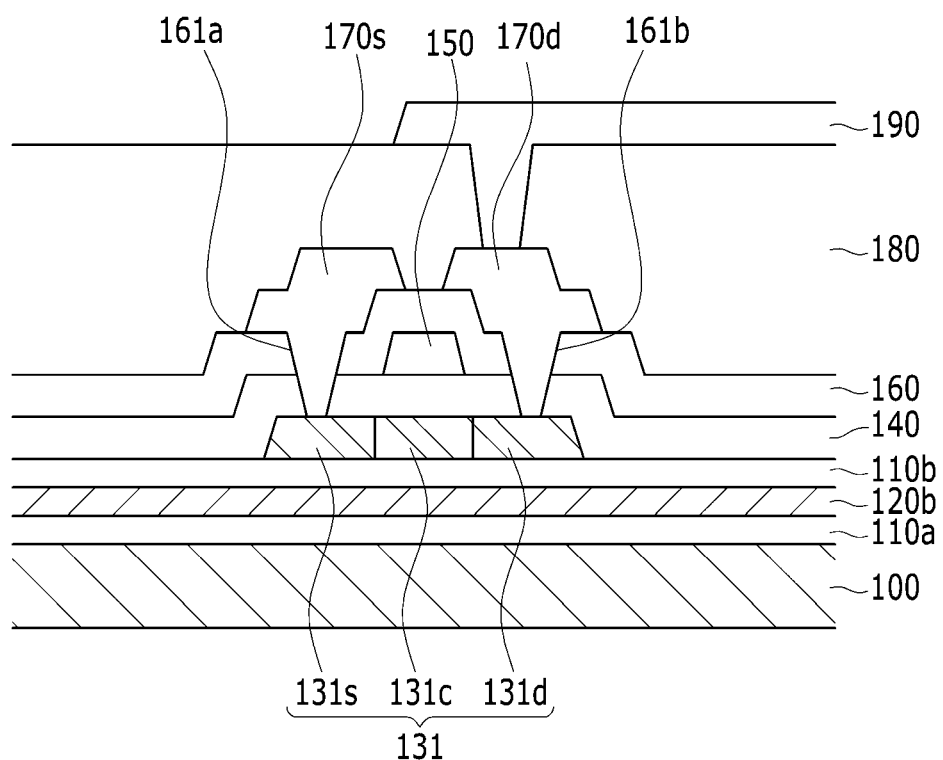
FIG. 4 schematically shows a thin film transistor array panel according to an exemplary embodiment of the present invention.

FIG. 4 schematically shows a thin film transistor array panel according to an exemplary embodiment of the present invention, and FIGS. 8 and 9a to 9c partially show modified exemplary embodiments according to different positions of a hydrogen diffusion prevention layer of the present invention.

First, referring to FIG. 4, a thin film transistor array panel according to an exemplary embodiment of the present invention may include the insulation substrate 100, the buffer layers 110a and 110b, the hydrogen diffusion prevention layer 120b, the polycrystal semiconductor layer 131, the gate electrode 150, the source electrode 170s, the drain electrode 170d, and the pixel electrode 190.

Referring to FIG. 4, the buffer layer 110a is disposed on the insulation substrate 100, and the hydrogen diffusion prevention layer 120b is formed on the buffer layer 110a. The hydrogen diffusion prevention layer 120b contains fluorine. The buffer layer 110b is disposed on the hydrogen diffusion prevention layer 120b, and the polycrystal semiconductor layer 131 is disposed on the buffer layer 110b. A gate insulation layer 140 is disposed on the polycrystal semiconductor layer 131, the gate electrode 150 overlaps the polycrystal semiconductor layer 131 and is disposed on the gate insulation layer 140, and an interlayer insulation layer 160 is disposed on the gate electrode 150. The first contact hole 161a exposing the source region 131s of the polycrystal semiconductor layer 131, and the second contact hole 161b exposing the drain region 131d of the polycrystal semiconductor layer 131, are formed in the interlayer insulation layer 160 and the gate insulation layer 140. In addition, the source electrode 170s and the drain electrode 170d, overlapping the polycrystal semiconductor layer and separated from each other, are disposed on the interlayer insulation layer 160. Also, the planarization layer 180 is disposed on the source electrode 170s and the drain electrode 170d, and the pixel electrode 190 is disposed on the planarization layer 180 to be electrically connected to the drain electrode 170d.

Although an exemplary embodiment is illustratively shown in FIG. 4, the present invention may be applied to thin film transistor array panels having bottom gate structures as well as those having top gate structures as shown in FIG. 4. It may also be applied to structures having various kinds of insulation layers and semiconductor layers, and various kinds of electrodes stacked in different sequences. For example, when the present invention is applied to the bottom gate structure, the buffer layers with the hydrogen diffusion prevention layer interposed therebetween are disposed on the gate electrode, and the polycrystal semiconductor layer is disposed on the buffer layer. The buffer layer may be made of an insulation material, and may act as the gate insulation layer. As described above, the buffer layer in the present invention may be made of an insulation material to act as various kinds of insulation layers. In other words, when the insulation layer is disposed below the semiconductor layer, the insulation layer may act as the buffer layer of the present invention, by including a hydrogen diffusion prevention layer containing fluorine within.

The hydrogen diffusion prevention layer 120b may be made of a material of the buffer layer along with fluorine. When the hydrogen diffusion prevention layer 120b is constructed in this manner, the hydrogen diffusion prevention layer 120b and the buffer layer may be continuously formed. The buffer layers 110a and 110b include a layer containing SiNx (hereinafter, referred to as a SiNx layer) and a layer containing SiOx (hereinafter, referred to as a SiOx layer) stacked on the SiNx layer. The hydrogen diffusion prevention layer 120b may be deposited at, for example, the middle of the SiNx layer, an interface between the SiNx layer and the SiOx layer, the middle of the SiOx layer, and above the SiOx layer.

Figure 8:
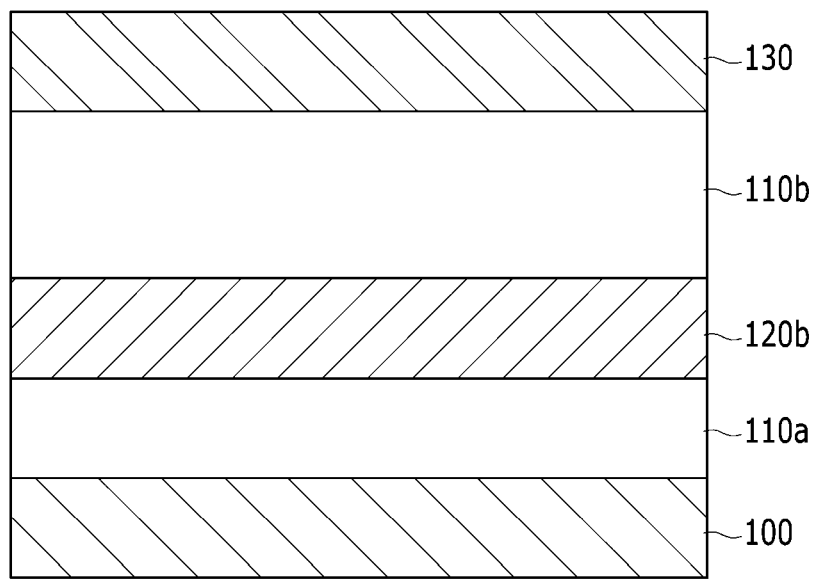
Figure 9A:
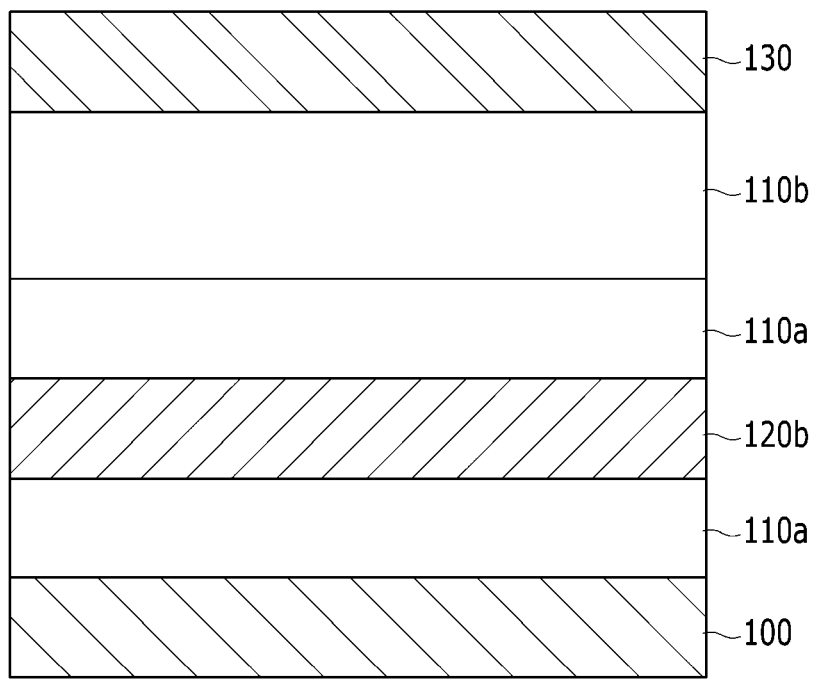
FIGS. 9a to 9c partially show modified exemplary embodiments according to different positions of a hydrogen diffusion prevention layer of the present invention.
Figure 9B:
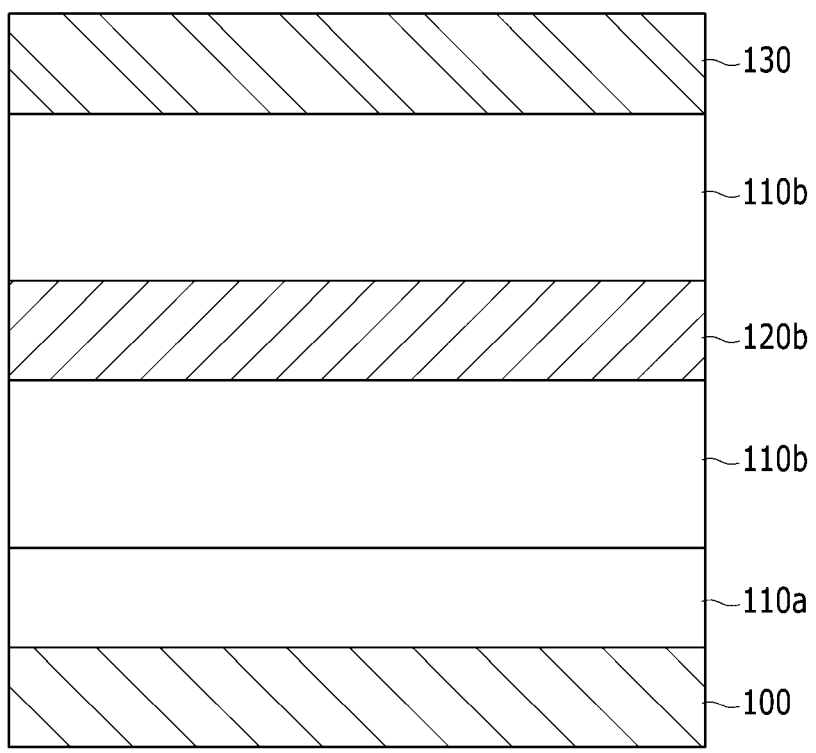
Figure 9C:
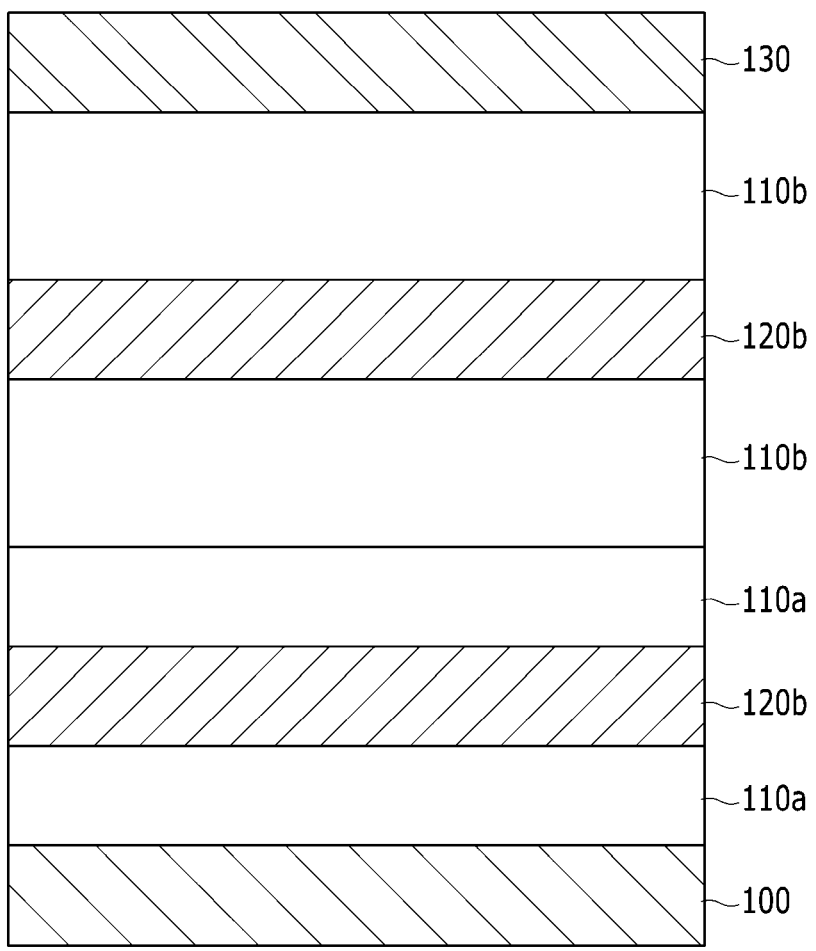

When specifically explaining the above structure with reference to FIGS. 8 and 9A to 9C, the buffer layers 110a and 110b and the hydrogen diffusion prevention layer 120b may be stacked in the following order: buffer layer 110a containing SiNx, the hydrogen diffusion prevention layer 120b, the buffer layer 110a containing SiNx, and the buffer layer 110b containing SiOx as shown in FIG. 9A. The layers may also be stacked in the order: buffer layer 110a containing SiNx, the hydrogen diffusion prevention layer 120b, and buffer layer 110b containing SiOx as shown in FIG. 8. Alternatively, the following order is also contemplated: buffer layer 110a containing SiNx, buffer layer 110b containing SiOx, the hydrogen diffusion prevention layer 120b, and buffer layer 110b containing SiOx as shown in FIG. 9B. In addition, although not shown in the drawings, the buffer layers and the hydrogen diffusion prevention layer may be stacked in the following sequence: buffer layer 110a containing SiNx, buffer layer 110b containing SiOx, and the hydrogen diffusion prevention layer 120b. Alternatively, and as shown in FIG. 9c, the buffer layers and the hydrogen diffusion prevention layer may be stacked in the following sequence: buffer layer 110a containing SiNx, the hydrogen diffusion prevention layer 120b, buffer layer 110a containing SiNx, buffer layer 110b containing SiOx, the hydrogen diffusion prevention layer 120b, and buffer layer 110b containing SiOx. That is, one or more hydrogen diffusion prevention layers 120b may be included. These layers 120b may be stacked in any order with any other buffer layers.

Even though the stacked structures of the buffer layers 110a and 110b and the hydrogen diffusion prevention layer 120b are described by preferable exemplary embodiments with reference to the drawings as described above, the invention is not limited to the drawings as shown and may include various stacked structures without departing from the spirit and scope of the appended claims. That is, any order of any such layers is contemplated.

The hydrogen diffusion prevention layer 120b may be made of, for example, SiOF or SiNF in the exemplary embodiments.

Figure 3:
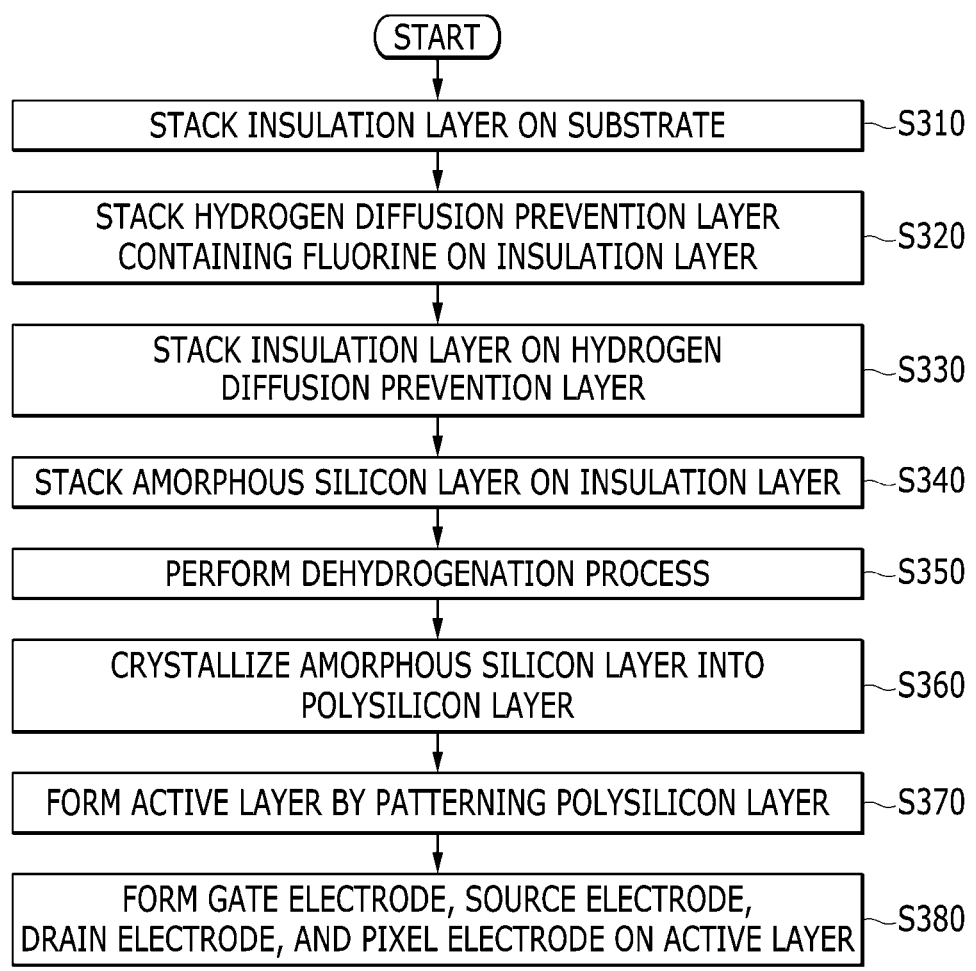
FIG. 3 is a flow chart of a method of manufacturing a thin film transistor array panel according to an exemplary embodiment of the present invention.

FIG. 3 is a flow chart of a method of manufacturing a thin film transistor array panel according to an exemplary embodiment of the present invention, and FIGS. 5 to 8 sequentially show a method of manufacturing the polysilicon layer according to an exemplary embodiment of the present invention. Hereinafter, a method of preparing a thin film transistor array panel will be described with reference to FIGS. 3 and 5 to 8.

Figure 5:
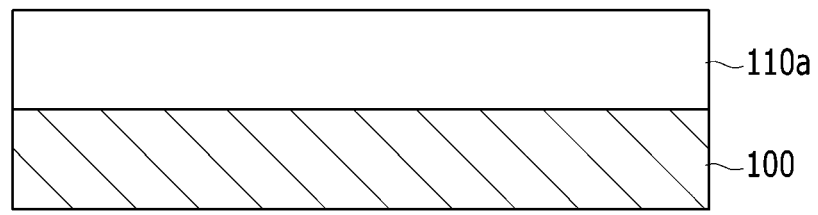
FIGS. 5 to 8 sequentially show a method of manufacturing a polysilicon layer according to an exemplary embodiment of the present invention.
Figure 6:
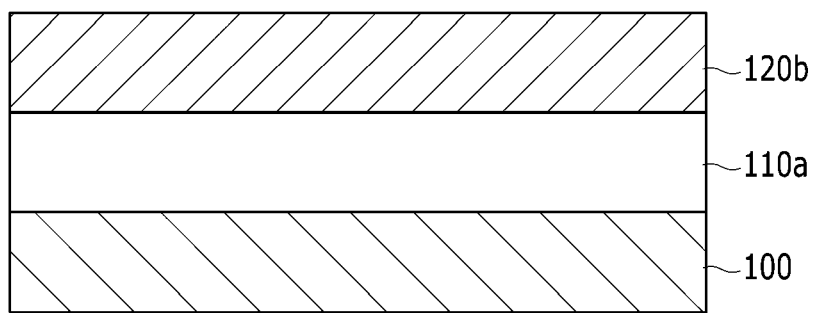

First, as shown in FIG. 5, the buffer layer 110a is stacked on the insulation substrate 100 (S310), and as shown in FIG. 6, the hydrogen diffusion prevention layer 120b containing fluorine is stacked on the buffer layer 110a (S320). Then, as shown in FIG. 8, the buffer layer 110b (S330) and the amorphous silicon layer 130 (S340) are sequentially stacked on the hydrogen diffusion prevention layer 120b. After the stacking is completed, the dehydrogenation process is performed on the buffer layers 110a and 110b, the hydrogen diffusion prevention layer 120b, and the amorphous silicon layer 130 as shown in the flow chart of FIG. 3 (S350). During the dehydrogenation process, hydrogen in the buffer layers 110a and 110b is prevented from being diffused into the amorphous silicon layer 130 due to fluorine in the hydrogen diffusion prevention layer 120b. After the dehydrogenation process is completed, the amorphous silicon layer 130 is crystallized into a polysilicon layer (S360). The polycrystal semiconductor layer 131 is formed by patterning this polysilicon layer (S370). The polycrystal semiconductor layer 131 includes the source region 131s connected to the source electrode, the drain region 131d connected to the drain electrode, and the channel region 131c positioned between the source region 131s and the drain region 131d. Then, the gate insulation layer 140 is formed on the polycrystal semiconductor layer 131, the gate metal layer is formed on the gate insulation layer 140, and the gate metal layer is patterned to form the gate electrode 150 in an island shape on the channel region 131c of the polycrystal semiconductor layer 131. The interlayer insulation layer 160 is formed on the gate electrode 150, and the first contact hole 161a and the second contact hole 161b, exposing portions of the source region 131s and the drain region 131d of the polycrystal semiconductor layer 131 respectively, are formed by patterning the interlayer insulation layer 160 together with the gate insulation layer 140. Then, the source electrode 170s and the drain electrode 170d, separated from each other and contacting the source region 131s and the drain region 131d of the polycrystal semiconductor layer 131 respectively through the first contact hole 161a and the second contact hole 161b, are formed on the interlayer insulation layer 160. The planarization layer 180 is formed on the source electrode 170s and the drain electrode 170d, and the pixel electrode 190 is formed on the planarization layer 180 to be electrically connected to the drain electrode (S380).

Although an exemplary embodiment is illustratively shown in FIG. 3, the present invention may be applied to methods of manufacturing thin film transistor array panels having bottom gate structures in addition to those having top gate structures as shown in FIG. 3, and is applicable to various kinds of insulation layers and semiconductor layers, and various kinds of electrodes stacked in different sequences. For example, when methods of the present invention are applied to the manufacture of a bottom gate structure, a process of forming the buffer layers on the gate electrode is performed, wherein the process of forming the buffer layers includes a process of forming the hydrogen diffusion prevention layer between the buffer layers, and then, a process of stacking the amorphous silicon layer on the buffer layer is performed. The buffer layer may be made of an insulation material, and may act as the gate insulation layer. As described above, the buffer layer in embodiments of the present invention is made of an insulation material to act as various kinds of insulation layers. In other words, when the insulation layer is disposed below the semiconductor layer, the insulation layer may act as the buffer layer of the present invention, by forming the fluorine-containing hydrogen diffusion prevention layer within the insulation layer.

The hydrogen diffusion prevention layer 120b may be made of a material of the buffer layer along with fluorine. When the hydrogen diffusion prevention layer 120b is made in this manner, the hydrogen diffusion prevention layer 120b and the buffer layer may be continuously formed to simplify the manufacturing process.

Figure 7:
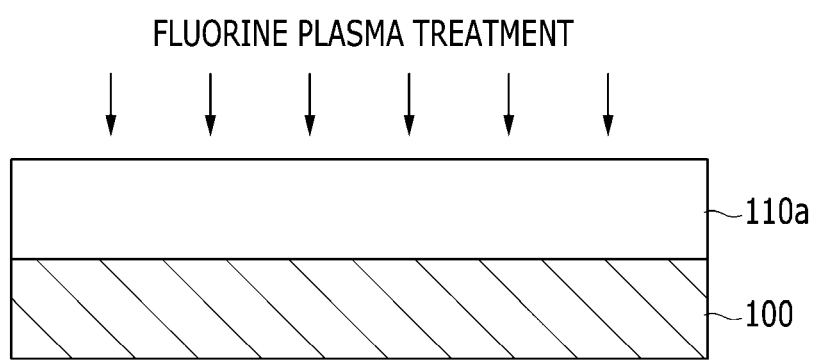

The hydrogen diffusion prevention layer 120b may be formed on the buffer layer 110a by plasma treatment using gas containing fluorine, as shown in FIG. 7.

The hydrogen diffusion prevention layer 120b may be deposited at one or more process points including: in the middle of a process of stacking the SiNx layer, after a process of stacking the SiNx layer, in the middle of a process of stacking the SiOx, and after a process of stacking the SiOx layer.

When specifically explaining the above with reference to FIGS. 8 and 9a to 9c, the buffer layers 110a and 110b and the hydrogen diffusion prevention layer 120b may be stacked in the order of buffer layer 110a comprising SiNx, hydrogen diffusion prevention layer 120b, buffer layer 110a comprising SiNx, and buffer layer 110b comprising SiOx as shown in FIG. 9a. Another order may be buffer layer 110a including SiNx, hydrogen diffusion prevention layer 120b, and buffer layer 110b including SiOx as shown in FIG. 8. A further order may be buffer layer 110a including SiNx, buffer layer 110b including SiOx, hydrogen diffusion prevention layer 120b, and buffer layer 110b including SiOx as shown in FIG. 9b.

In addition, the buffer layers and the hydrogen diffusion prevention layer may be stacked in the following sequence: buffer layer 110a including SiNx, buffer layer 110b including SiOx, and hydrogen diffusion prevention layer 120b, as shown in FIG. 9c. Alternatively, the buffer layers and the hydrogen diffusion prevention layer may be stacked in the order of buffer layer 110a including SiNx, hydrogen diffusion prevention layer 120b, another buffer layer 110a including SiNx, buffer layer 110b including SiOx, hydrogen diffusion prevention layer 120b, and buffer layer 110b including SiOx. That is, one or more hydrogen diffusion prevention layers 120b may be deposited in any order.

Even though the stacked sequences of the buffer layers 110a and 110b and the hydrogen diffusion prevention layer 120b are described by preferable exemplary embodiments with reference to the drawings as described above, the invention is not limited to the drawings as shown and may include various stacked sequences without departing from the spirit and scope of the appended claims.

The hydrogen diffusion prevention layer 120b may be deposited using, for example, SiOF or SiNF in the exemplary embodiments.

In addition, in the exemplary embodiments, the hydrogen diffusion prevention layer 120b may be formed on the buffer layer 110a by plasma treatment using gas containing fluorine, as shown in FIG. 7.

Hereinafter, effects obtained by exemplary embodiments of the present invention will be described with reference to FIGS. 10a and 10b.

Figure 10A:
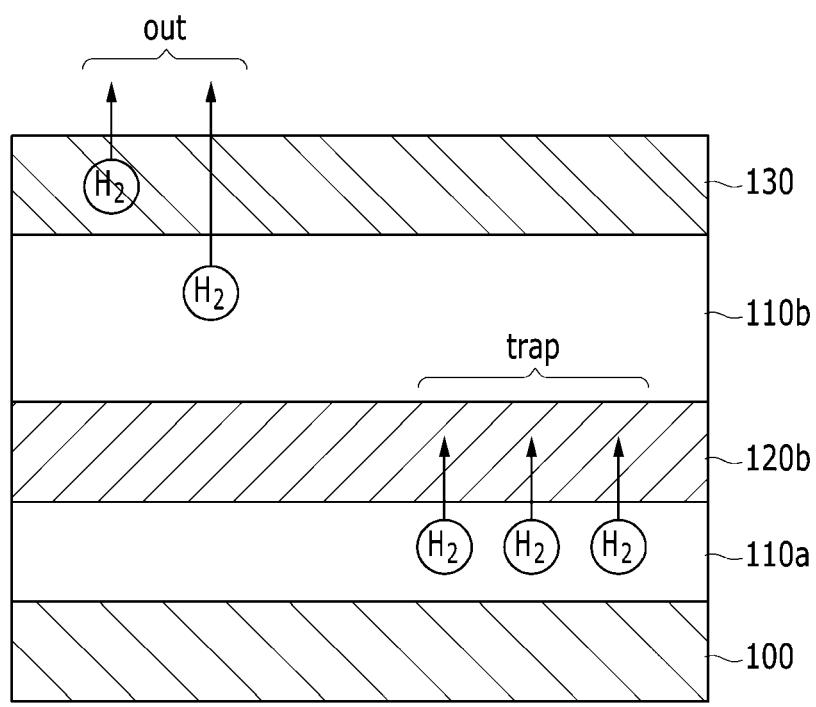
FIG. 10a schematically shows an effect obtained by an exemplary embodiment of the present invention.
Figure 10B:
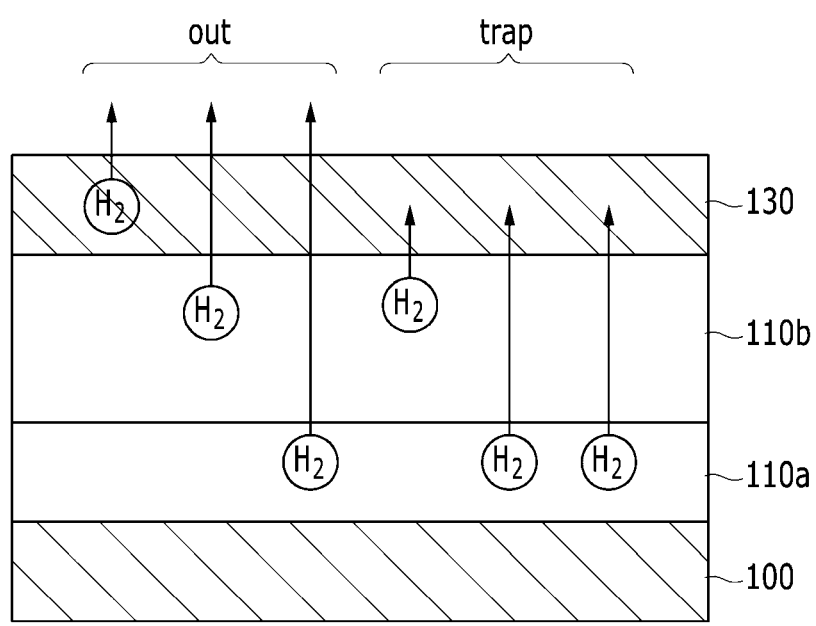
FIG. 10b schematically shows an effect obtained by a Comparative Example of the present invention.

FIG. 10A schematically shows an effect obtained by an exemplary embodiment of the present invention, and FIG. 10B schematically shows an effect obtained by a Comparative Example of the present invention.

FIG. 10a schematically shows hydrogen diffusion generated during the dehydrogenation process after the insulation substrate 100, the buffer layer 110a, and the hydrogen diffusion prevention layer 120b, the buffer layer 110b, and the amorphous silicon layer 130 are sequentially stacked. The purpose of the dehydrogenation process is to remove hydrogen from the buffer layers 110a and 110b and the amorphous silicon layer 130. When some hydrogen from the buffer layers 110a and 110b is trapped by the amorphous silicon layer 130, hydrogen trapped in the amorphous silicon layer 130 is diffused into the environment during subsequent processes such as a process of crystallizing the amorphous silicon layer 130 into the polysilicon layer, such that film burst may occur and surface roughness may be increased. However, when the hydrogen diffusion prevention layer 120b is disposed between the buffer layers 110a and 110b, hydrogen escaping the buffer layers 110a and 110b is trapped in the hydrogen diffusion prevention layer 120b. Since fluorine in the hydrogen diffusion prevention layer 120b has an effect of preventing diffusion of hydrogen, the hydrogen diffusion prevention layer 120b acts as a hydrogen trap site to maximize the dehydrogenation effect. When diffused hydrogen is trapped in the hydrogen diffusion prevention layer 120b before arriving at the amorphous silicon layer 130, the amount of hydrogen trapped in the amorphous silicon layer 130 may be decreased so that problems such as film burst, an increase in roughness, and the like, may be decreased in the subsequent processes such as a crystallizing process, and due to a decrease in total amount of hydrogen in the buffer layers 110a and 110b, current flow may be improved, that is, characteristics of the LTPS thin film transistor may be improved.

FIG. 10b shows a Comparative Example. When the hydrogen diffusion prevention layer is not present in the buffer layers 110a and 110b, hydrogen in the buffer layers 110a and 110b are diffused and trapped in the amorphous silicon layer 130 in the dehydrogenation process, and therefore, the dehydrogenation effect is decreased. Then, hydrogen trapped in the amorphous silicon layer 130 escapes from the layer 130 during the process of crystallizing the amorphous silicon layer 130 into the polysilicon layer, such that film burst may occur and surface roughness may be increased.

FIGS. 11 and 12 are Tables showing experimental results according to an exemplary embodiment of the present invention.

FIG. 11 is Table showing experimental results which confirms a decrease in the hydrogen amount in the buffer layers when the hydrogen diffusion prevention layer 120b containing SiNF is stacked between a buffer layer 110a containing SiNx and a buffer layer 110b containing SiOx. It is confirmed that in this case, the total amount (at %) of hydrogen in the buffer layers(110a, 110b) were decreased from 23.96 to 13.9, which corresponds to a decrease of 42%. In addition, it is confirmed that a Cu etchant etch rate (Å/s) was decreased from 47.8 to 6.6, such that etch damage was reduced, due to the fact that the hydrogen diffusion prevention layer 120b exhibits tight chemical binding, such that hardness of the buffer layers 110a is increased. When hardness of the buffer layers 110a is increased, diffusion of hydrogen generated from a lower part may be more effectively chemically and physically prevented.

FIG. 12 is Table showing experimental results which confirms a decrease in the hydrogen amount in the buffer layers when a hydrogen diffusion prevention layer 120b including SiOF is stacked between a buffer layer 110a including SiNx and a buffer layer 110b including SiOx. It is confirmed that the total amount (at %) hydrogen in buffer layers(110a, 110b) were decreased from 6.01 to 3.69, which corresponds to a decrease of 39%. In addition, it is confirmed that in measurement of FT-IR, a Si—O peak position (1/cm) was increased from 1056.5 to 1067.0, which means that SiOF is stronger than SiOx in view of Si—O bond. When the hydrogen diffusion prevention layer 120b consisting of SiOF having strong Si—O bond is stacked, the hardness of the buffer layer 110a is increased, and diffusion of hydrogen generated from a lower part may be more effectively chemically and physically prevented.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Furthermore, different features of the various embodiments, disclosed or otherwise understood, can be mixed and matched in any manner to produce further embodiments within the scope of the invention.

DESCRIPTION OF SYMBOLS

100: insulation substrate 110a, 110b: buffer layer
120a: buffer layer containing fluorine 120b: hydrogen diffusion prevention layer
130: amorphous silicon layer 131: polycrystal semiconductor layer
140: gate insulation layer 150: gate electrode
160: interlayer insulation layer 170s: source electrode 170d: drain electrode
180: planarization layer 190: pixel electrode

What is claimed is:

1. A method of manufacturing a thin film transistor array panel, the method comprising:
    stacking a buffer layer containing fluorine on an insulating substrate;
    stacking an amorphous silicon (a-Si) layer on the buffer layer;
    performing a dehydrogenation process on the buffer layer and the amorphous silicon layer;
    crystallizing the amorphous silicon layer so as to form a polysilicon (poly-Si) layer;
    forming a polycrystal semiconductor layer by patterning the polysilicon layer;
    forming a gate electrode overlapping the polycrystal semiconductor layer;
    forming a source electrode and a drain electrode overlapping the polycrystal semiconductor layer and separated from each other; and
    forming a pixel electrode electrically connected to the drain electrode.

2. The method of claim 1, wherein:
    the stacking a buffer layer further comprises forming one or more hydrogen diffusion prevention layers that include the fluorine.

3. The method of claim 2, wherein:
    the one or more hydrogen diffusion prevention layers comprise a material of the buffer layer and further comprise the fluorine.

4. The method of claim 3, wherein:
    the one or more hydrogen diffusion prevention layers are formed by plasma treatment using a gas containing the fluorine.

5. The method of claim 2, wherein:
    the stacking a buffer layer further comprises stacking a SiOx layer on a SiNx layer, and
    the forming one or more hydrogen diffusion prevention layers is performed during a process of stacking the SiNx layer, after a process of stacking the SiNx layer, during a process of stacking the SiOx layer, or after a process of stacking the SiOx layer.

6. The method of claim 5, wherein:
    the one or more hydrogen diffusion prevention layers comprise SiOF or SiNF.

7. The method of claim 5, wherein:
    the one or more hydrogen diffusion prevention layers are formed by plasma treatment using a gas containing the fluorine.

* * * * *